June 20, 1967 W. L. DEEG ETAL 3,327,177
COUNTING CIRCUIT
Filed May 8, 1964
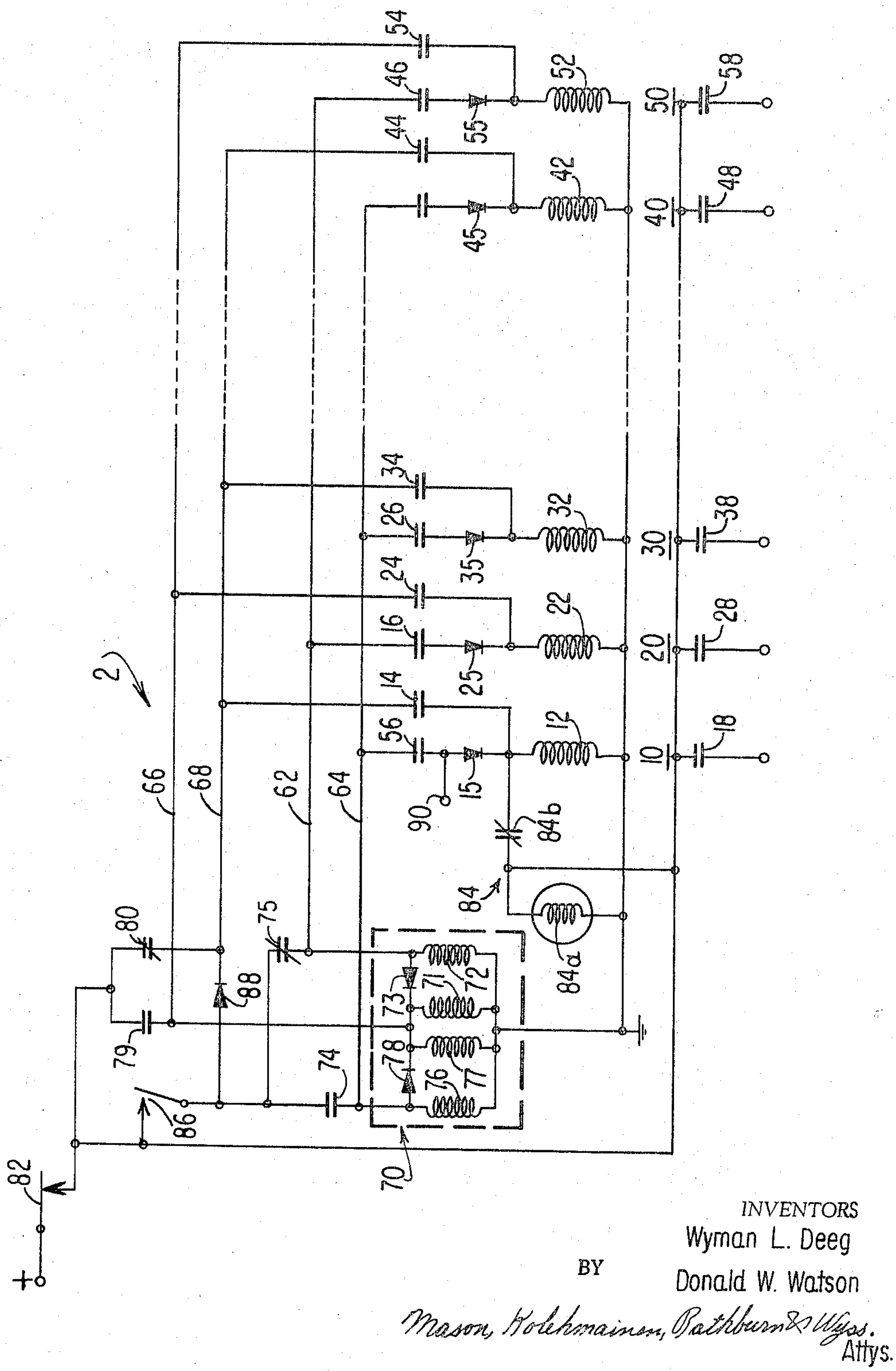
INVENTORS
Wyman L. Deeg
BY Donald W. Watson
Mason, Kolehmainen, Rathburn & Wyss.
Attys.

United States Patent Office 3,327,177

Patented June 20, 1967

3,327,177
COUNTING CIRCUIT

Wyman L. Deeg, Glenview, and Donald W. Watson, Arlington Heights, Ill., assignors to C. P. Clare & Company, Chicago, Ill., a corporation of Delaware Filed May 8, 1964, Ser. No. 366,030
5 Claims. (Cl. 317—140)

This invention relates to a counting circuit and, more particularly, to a counting circuit using sealed magnetic switches.

The acknowledged advantages of sealed magnetic or magnetic reed switches makes it desirable to develop circuits of various types using sealed switches so as to extend the advantages of this type of switching to as many fields and applications as possible. Counting circuits are one such application in which the operating life and performance of the circuit is substantially enhanced by using sealed magnetic switches. A counting circuit using sealed switches should also require a minimum of parts so as to reduce to a minimum both the cost of the circuit and the installation space required.

Accordingly, one object of the present invention is to provide a new and improved counting circuit.

Another object is to provide a new and improved counting circuit including sealed magnetic switch units.

A further object is to provide a counting circuit of the type using sealed magnetic switch units in which the number of switch units and operating windings required is substantially reduced.

Another object is to provide a counting circuit in which successive stages of the counter are alternately coupled to a pair of input signal conductors and in which a bistable input circuit controlled by a series of incoming signals alternately applies operating signals to the pair of signal conductors.

A further object is to provide a counting circuit in which successive stages of the counter are alternately coupled to a pair of input signal conductors and a pair of holding conductors and in which a bistable input circuit controlled by a series of incoming signals alternately energizes the pair of holding conductors and alternately applies operating signals to the pair of signal conductors.

In accordance with these and many other objects, an embodiment of the present invention comprises a counting circuit in which each stage of the counter is formed by an operating winding having a plurality of sealed magnetic switches associated therewith. One of the sealed switches in each of the stages provides an output means. Another of the switches completes a holding circuit for the stage, and another of the sealed switches prepares an operating circuit for the next stage to be operated. The holding and operating circuits for alternate ones of the stages are coupled through these contacts to alternate ones of a pair of holding or latching conductors, and alternate ones of a pair of input signal or counting conductors. A bistable input control unit utilizing sealed magnetic switches and associated differential windings provides means for alternately energizing or applying signals to the pairs of latching and counting conductors to synchronize the sequential operation of the stages of the counter with a series of input signals applied to the input control unit.

Many other objects and advantages of the present invention will become apparent from considering the following detailed description in conjunction with the single figure of drawing which comprises a schematic diagram of a counting circuit embodying the present invention.

Referring now more specifically to the drawing, therein is illustrated a counting circuit 2 which embodies the present invention and which uses only sealed switch units as switching means in its construction. In general, the counter 2 includes a given number of counting stages, such as five illustrated stages 10, 20, 30, 40, and 50, which are selectively coupled to odd and even counting conductors 62 and 64, respectively, and odd and even latching or holding conductors 66 and 68, respectively. The counting stages 10, 20, 30, 40, and 50 are operated in sequence in response to the selective application of signals to the conductors 62, 64, 66, and 68 under the control of a bistable input control unit indicated generally as 70.

Referring now more specifically to the counting stages, each of the counting stages, such as the first counting stage 10, includes an operating winding 12 and three sealed magnetic switch units providing a plurality of normally open contacts designated as 14, 16, and 18. The construction of the counting stages 10, 20, 30, 40, and 50 is identical, and the component parts of the stages are designated by reference numbers having identical units digits for like parts to which the tens digit of the related stage is affixed. Thus, the windings in the first and second counting stages 10 and 20 are designated 12 and 22, respectively.

In each of the counting stages, such as the counting stage 10, the contacts similar to the contacts 14 provide a holding circuit extending between the operating winding of the switching means in the stage and one of the latching conductors 66 or 68. The contacts similar to the contacts 16 connect the operating winding of the next adjacent stage, such as the winding 22 in the stage 20, to one of the counting or input conductors 62 and 64. The remaining contacts 18 provided by the third sealed switch are used to provide an output indication and are connected in series between an output terminal and a source of reference potential through a normally closed reset switch 82.

The bistable input control unit 70 comprises a control module of the type shown and described in detail in the copending application of Wyman L. Deeg, Ser. No. 210,119, filed July 16, 1962, now Patent No. 3,244,942. In general, this control unit includes a pair of windings 71 and 72 coupled by a diode 73, which, when energized, produce oppositely poled flux fields of equal value for selectively controlling the actuation of two sealed magnetic switches providing a pair of normally open contacts 74 and a pair of normally closed contacts 75. Similarly, a pair of differential windings 76 and 77 coupled by a diode 78, when energized, produce oppositely poled flux fields of equal value for controlling the actuation of two sealed magnetic switches providing a pair of normally open contacts 79 and a pair of normally closed contacts 80. In the normal condition of the counting circuit 2, the positive potential supplied through the closed reset switch 82 is forwarded through the normally closed contacts 80 to the even latching conductor 68.

When the counting circuit 2 is to be placed in operation, the reset switch 82 is momentarily opened to remove all energizing potentials from this circuit to insure that the components thereof are released or restored to a normal condition. When the switch 82 is reclosed, a zero set or priming relay 84 including an operating winding 84*a* and a pair of normally closed contacts 84*b* is operated. More specifically, the potential supplied from the closed contacts 82 is forwarded through the closed contacts 84*b* to complete an energizing circuit for the winding 12 in the first counter stage 10. The energization of the winding 12 closes the contacts 14, 16, and 18. The closure of the contacts 14 completes a holding or latching circuit for the winding 12 extending through the closed contacts 14 and over the even latching conductor 68 and the normally closed contacts 80 in the control unit 70 to the positive potential supplied at the closed reset switch 82. This holding circuit maintains the winding 12 energized when the contacts 84*b* are opened by the operation of the relay 84, this relay being operated by the energization of the winding 84*a* which is connected across the potential source by the closure of the reset switch 82 and which remains energized until the counting circuit 2 is reset. The closure of the contacts 16 connects the operating winding 22 in the second counting stage 20 to the odd counting conductor 62 through a diode 25. The odd counting conductor 62 is connected through the normally closed contacts 75 to a normally open switch 86 which provides a source of input signals to be counted. The closure of the contacts 18 energizes the related output terminal to indicate that the first counting stage 10 is in an operated condition. When the counting circuit 2 provides, for instance, a decade counter, the closure of the contacts 18 can represent the fact that the counter is in an "0" representing position.

When the first pulse is to be counted, the switch 86 is closed to forward a latching potential through a diode 88 to supplement the holding potential now supplied through the closed contacts 80. This positive potential is also forwarded through the closed contacts 75 and 16 and the diode 25 to energize the operating winding 22 of the next counting stage 20. When the winding 22 is energized, the contacts 24, 26, and 28 are closed. The closure of the contacts 28 provides an indication that the second stage of the counter has been operated, and the closure of the contacts 24 prepares a holding circuit extending to the odd latching conductor 66. The closure of the contacts 26 connects the operating winding 32 in the next counting stage 30 to the even counting conductor 64 through a blocking diode 35.

The positive potential provided by the closed contacts 86 is also forwarded through the closed contacts 75 to one input of the bistable control unit 70. This potential directly energizes the winding 72 and is forwarded through the diode 73 to energize the windings 71 and 77. Since both of the windings 71 and 72 are energized to provide flux fields of opposite polarity and equal value, the operative state of the contacts 74 and 75 is not altered. However, since only the winding 77 is energized, the contacts 80 are opened and the contacts 79 are closed. The closure of the contacts 79 completes the previously prepared holding circuit extending through the closed contacts 24 for maintaining the winding 22 in the second counter stage 20 in an energized condition. The opening of the contacts 80 interrupts the above-described holding circuit extending over the even latching conductor 68 and the closed contacts 14 to the winding 12 in the first counting stage 10. However, this winding remains energized through the diode 88 for so long as the switch 86 remains in a closed condition.

When the switch 86 is opened, the holding circuit including the diode 88 and the closed contacts 14 is interrupted so that the winding 12 is no longer energized and the contacts 14, 16, and 18 are opened to restore the first counting stage 10 to a normal condition. The opening of the switch 86 also removes the potential supplied through the closed contacts 75 to the windings 71, 72, and 77. However, the prior closure of the contacts 79 maintains the windings 71 and 77 in an energized condition. Thus, the contacts 79 and 80 remain operated to the respective closed and opened conditions described above. The continued energization of the winding 71 coupled with the termination of the energization of the winding 72 actuates the second group of switches so that the contacts 74 are closed and the contacts 75 are opened. The opening of the contacts 75 disconnects the input signal source 86 from the odd input conductor 62 and one input to the bistable control unit 70, and the closure of the contacts 74 connects the input signal source provided by the switch 86 to the even counting or input conductor 64 and to the other input of the bistable control unit 70. The counting circuit 2 remains in this condition until the next input signal is received.

When the next pulse to be counted arrives, represented by the closure of the switch 86, the positive potential is forwarded over the closed contacts 74, the even counting conductor 64, the closed contacts 26, and the diode 35 to energize the winding 32 in the third counting stage 30. In response to energization of the winding 32, the contacts 34 and 38 and an additional set of contacts (not shown) are closed. The closure of the contacts 34 connects the winding 32 to the even holding or latching conductor 68 which is energized through the diode 88 from the closed switch 86. Thus, the winding 32 is maintained energized over this holding circuit. The closure of the contacts 38 provides an output indication representing the fact that the third counting stage 30 is in an operated condition. The additional pair of contacts corresponds to the contacts 16 and 26, for instance, and connects the next counting stage to the odd counting conductor 62.

The positive potential forwarded through the closed contacts 74 from the closed switch 86 also directly energizes the winding 76 and is forwarded through the diode 78 to continue the energization of the windings 71 and 77. When the winding 76 is energized to develop a flux field of opposite polarity to the flux field developed by the winding 77, the switches forming the contacts 79 and 80 are released so that the contacts 79 are opened and the contacts 80 are closed. The closure of the contacts 80 provides a supplemental source of holding potential for the even latching conductor 68 to maintain the winding 32 in the third counting stage 30 in an energized condition. The opening of the contacts 79 interrupts one source of holding potential for the odd latching conductor 66 for energizing the winding 22 in the preceding stage 20. However, the conductor 66 also receives holding potential from the closed switch 86 through the closed contacts 74 and the diode 78.

When the switch 86 is opened to terminate the input pulse, none of the windings 71, 72, 76, and 77 in the bistable input control unit 70 is energized, and the remaining two sealed switches forming the contacts 74 and 75 are restored to their normal condition so that the contacts 74 are opened and the contacts 75 are closed. The opening of the contacts 74 disconnects the input switch 86 from one terminal of the bistable control unit 70 and the even counting conductor 64, and the closure of the contacts 75 connects the switch 86 to the odd counting conductor 62 and to the other input of the bistable control unit 70. Further, when the switch 86 is opened, the potential previously forwarded to the odd latching conductor 66 through the diode 78 is removed so that the holding circuit for the winding 22 in the second counting stage 20 is removed. This releases the second counting stage so that the contacts 24, 26, and 28 are opened. The opening of the contacts 26 interrupts the operating circuit for the third stage 30, but the winding 32 remains energized over the holding circuit including the conductor 68 and the closed contacts 80. The opening of the contacts 24 interrupts an additional point in the holding circuit for the winding 22, and the opening of the contacts 28 removes the output indication representing the second counting stage 20.

This sequential operation of the stages in the counter 2 under the control of the pulses or potentials alternately applied to the odd and even counting conductors 62 and 64 and odd and even latching conductors 66 and 68 continues until such time as all of the input pulses have been counted. The counting circuit 2 can be provided with a number of counting stages similar to the stages 10, 20, 30, 40, and 50 in accordance with the application or system for which the circuit is designed.

The circuit 2 can also be used as a closed counting ring providing a carry pulse at the end of each cycle of operation. If the circuit 10 is assumed to provide a decade counter in which the last counting stage 50 represents the receipt of nine input pulses, the operation of the stage 50 following the receipt of nine pulses closes the contacts 54, 56, and 58. The contacts 54 complete a holding circuit for the winding 52 extending the odd latching conductor 66, and the contacts 58 provide the usual output indication. The closed contacts 56 connect the winding 12 in the first counting stage 10 to the even counting conductor 64 through a blocking diode 15. The closed contact 56 also connect the even counting conductor 64 to a carry terminal 90. Thus, when the next or tenth input pulse is received, the first counting state representing "0" is operated, and the ninth counting stage 50 representing "9" is restored to a normal condition. As indicated above, the counting circuit 2 is restored to a normal condition by momentarily opening the reset switch 82 to remove the holding potential from the bistable input control unit 70 and all of the counting stages 10, 20, 30, 40, and 50. The reclosure of the reset switch 82 causes the operation of the priming or zero set relay 84 which places the first counting stage 10 in an operated condition.

As described above, the circuit 2 includes the switches or contacts 18, 28, 38, 48, and 58 for providing an output. Additional isolated outputs can be provided by adding sealed switch units to each of the counting or control modules forming the counting stages 10, 20, 30, 40, and 50. However, in certain applications in which the counting circuit 2 is to be carried on standard sizes of printed circuit boards, there is a limit to the number of sealed switches that can be added to the modules. Accordingly, the circuit includes additional means for deriving non-isolated outputs that are useful for a number of purposes.

As an example, the counter 2 includes a set of output terminals connected to the point of common connection of the contacts 14, 24, 34, 44, and 54 and the windings 12, 22, 32, 42, and 52. This set of terminals provides a bridged output derived from the system potential source. Each of these terminals is energized at the beginning of the input pulse operating the related counter stage and remains energized until the end of the next input signal that operates the next higher stage. This type of bridged output can, for example, be used with lamp or other visible display indicators in which the overlapped energization provided by the bridge output signal is not a source of error. In addition, a non-bridged voltage output can be derived from connections to the anode terminals of the diodes 15, 25, 35, 45, and 55. This non-bridged output, which persists only during the length of each input pulse, is suitable for use with such equipment as printers and recorders in which a bridged output might cause an erroneous indication.

The resetting switch 82 and the input pulse generating switch 86 are shown as comprising manually actuated switches to simplify the illustration of the invention. However, it should be understood that these switching means can comprise transistors, similar controlled conduction devices, or electromagnetically operated relays. The operating life of the sealed switches is extended because only the components 82, 84, and 86 ever switch a voltage substantially larger than the forward drop across one of the diodes in the circuit 2.

Although the present invention has been described with reference to a single illustrative embodiment thereof, it should be understood that numerous other modifications and embodiments can be devised by those skilled in the art that will fall within the spirit and scope of the principles of this invention.

What is claimed and desired to be secured by Letters Patent of the United States is:

1. A counting circuit for use with a series of time spaced input signals comprising a plurality of relays each including an operating winding and at least first and second contacts, a pair of holding conductors, a pair of counting conductors, circuit means connecting the relays as successive stages in a counting sequence, said circuit means including a plurality of first circuits each including the first contacts of the relay in one stage connected between the operating winding of the relay in the next highest stage and one of the counting conductors, the first circuits for successive stages being connected to alternate ones of the pair of counting conductors, said circuit means also including a plurality of second circuits each including the second contacts of the relay in one stage connected between the operating winding of the relay in this one stage and one of the pair of holding conductors, the second circuits for successive stages being connected to alternate ones of the pairs of holding conductors, a potential source, a signal source of time spaced input signals, and a control circuit connected to the signal source and operable between two alternate states by successive signals received from the source, said control circuit including first and second switching means each operable to two alternate conditions as the control circuit is operated to its two alternate states, the first switching means being connected to the potential source and connecting the potential source to one and then the other of the pair of holding conductors, the second switching means being connected to the signal source and connecting the signal source to one and then the other of the pair of counting conductors.

2. A counting circuit for use with a series of time spaced input signals comprising a plurality of relays each including an operating winding and at least first and second contacts, a pair of holding conductors, a pair of counting conductors, a potential source, circuit means connecting the relays as successive stages in a counting sequence, said circuit means including a plurality of first circuits each including the first contacts of the relay in one stage connected between one terminal of the operating winding of the relay in the next highest stage and one of the counting conductors, the first circuits for successive stages being connected to alternate ones of the pair of counting conductors, said circuit means also including a plurality of second circuits each including the second contacts of the relay in one stage connected between one terminal of the operating winding of the relay in this one stage and one of the pair of holding conductors, the second circuits for successive stages being connected to alternate ones of the pairs of holding conductors, said circuit means also including means connecting the other terminal of all of the windings to one side of the potential source, a bistable relay means operable to two alternate stable states and including first and second switching means operable to two alternate conditions as the bistable relay means is operated to its different stable states, first means connecting the first switching means between the other side of the potential source and the holding conductor so that the first switching means alternately connects the other side of the potential source to one and then the other of the holding conductors, a signal source providing time spaced signals, and second means connecting the second switching means between the signal source and the pair of counting conductors so that the second switching means alternately connects the signal source to one and then the other of the counting conductors.

3. The counting circuit set forth in claim 2 including diode means connected between the signal source and the pair of holding conductors to supply the time spaced signals from the signal sources to the holding conductors.

4. A counting circuit for use with a series of time spaced input signals comprising a plurality of relays each including an operating winding and at least first and second contacts, an odd and an even holding conductor,
an odd and an even counting conductor,
circuit means connecting the relays as successive stages in a counting sequence, said circuit means including a plurality of first circuits each including the first contacts of the relay in one stage connected between the operating winding of the relay in the next highest stage and one of the counting conductors, the first circuits for successive stages being connected to alternate ones of the pair of counting conductors, said circuit means also including a plurality of second circuits each including the second contacts of the relay in one stage connected between the operating winding of the relay in this one stage and one of the pair of holding conductors, the second circuits for successive stages being connected to alternate ones of the pairs of holding conductors, the first circuit for a given stage being connected to the odd holding conductor and the second circuit of this given stage being connected to the even counting conductor, the first circuit for the stage in the sequence adjacent the given stage being connected to the even holding conductor and the second circuit for this adjacent stage being connected to the odd counting conductor,
a potential source,
a signal source of time spaced input signals,
and a bistable circuit operable between first and second alternate states, said control circuit including first and second switching means each operable to two alternate conditions as the control circuit is operated to its first and second alternate states, the first switching means being connected to the potential source and connecting the potential source to the even holding conductor when the bistable circuit is in its first state and connecting the potential source to the odd holding conductor when the bistable circuit is in its second state, the second switching means being connected to the signal source and connecting the signal source to the even counting conductor when the bistable circuit is in its first state and connecting the signal source to the odd counting conductor when the bistable circuit is in its second state.

5. A counting circuit for counting time spaced input signals comprising
a pair of normally closed contacts and a pair of normally open contacts,
relay means for opening the closed contacts and for closing the open contacts, a control circuit connected to the relay means for alternately operating and releasing the relay means,
means for supplying the input signals to the normally closed and the normally open contacts,
a first counting conductor connected to the normally closed contacts,
a second counting conductor connected to the normally open contacts to receive an input signal when the normally open contacts are closed,
a plurality of relays each having an operating winding and a set of contacts operated by the winding,
and circuit means connecting the relays as successive stages in a counting sequence to count the input signals, said circuit means including a plurality of first circuits connected in parallel with each other between the first counting conductor and the operating windings of a first group of the relays and a plurality of second circuits connected in parallel with each other between the second counting conductor and the operating windings of a second group of the relays, the first circuit for a given relay in the first group including a set of contacts from a relay in the second group connected in series between the first counting conductor and the operating winding and the second circuit for a given relay in the second group including a set of contacts from a relay in the first group connected in series between the second counting conductor and the operating winding, the relays of the first and second groups being alternated with each other in the counting sequence so that the operation of a relay in the first group prepares a second circuit for a relay in the second group and the operation of a relay in the second group prepares a first circuit for a relay in the first group to permit the sequential operation of the relays in the first and second group as input signals are alternately applied to the first and second counting conductors by the normally open and closed contacts.

References Cited

UNITED STATES PATENTS

| | | | |
|---|---|---|---|
| 2,590,879 | 4/1952 | McAlpine | 317—140 |
| 2,954,511 | 9/1960 | Jackel | 317—140 |
| 3,076,918 | 2/1963 | Hinkle et al. | 317—140 |

MILTON O. HIRSHFIELD, *Primary Examiner.*

J. A. SILVERMAN, *Assistant Examiner.*